(12) United States Patent
Palmateer et al.

(10) Patent No.: US 8,682,130 B2
(45) Date of Patent: Mar. 25, 2014

(54) METHOD AND DEVICE FOR PACKAGING A SUBSTRATE

(75) Inventors: Lauren Palmateer, San Francisco, CA (US); William J. Cummings, Clinton, WA (US); Brian Gally, Lost Gatos, CA (US); Mark Miles, Atlanta, GA (US); Jeffrey B. Sampsell, Pueblo, CO (US); Clarence Chui, San Jose, CA (US); Manish Kothari, Cupertino, CA (US)

(73) Assignee: QUALCOMM Mems Technologies, Inc., San Diego, CA (US)

( * ) Notice: Subject to any disclaimer, the term of this patent is extended or adjusted under 35 U.S.C. 154(b) by 274 days.

(21) Appl. No.: 13/231,640

(22) Filed: Sep. 13, 2011

(65) Prior Publication Data

US 2012/0002266 A1    Jan. 5, 2012

Related U.S. Application Data

(63) Continuation of application No. 12/192,908, filed on Aug. 15, 2008, now Pat. No. 8,045,835, which is a continuation of application No. 11/045,738, filed on Jan. 28, 2005, now Pat. No. 7,424,198.

(60) Provisional application No. 60/613,318, filed on Sep. 27, 2004.

(51) Int. Cl.
  *G02B 6/00*      (2006.01)
  *G02B 26/00*     (2006.01)
  *G02B 26/08*     (2006.01)

(52) U.S. Cl.
  CPC .......... *G02B 26/007* (2013.01); *G02B 26/0833* (2013.01); *G02B 26/0825* (2013.01)
  USPC .......................................... 385/147; 359/247

(58) Field of Classification Search
  CPC .......... G02B 26/007; G02B 266/0833; G02B 26/0825
  USPC .......... 385/147; 359/247, 820, 290; 438/106, 438/51
  See application file for complete search history.

(56) References Cited

U.S. PATENT DOCUMENTS 2,534,846 A    12/1950   Ambrose et al.
3,439,973 A    4/1969    Bernt et al.
(Continued)

FOREIGN PATENT DOCUMENTS

CN    1449990      10/2003
DE    10200869 A1  7/2003
(Continued)

OTHER PUBLICATIONS

Office Action dated May 18, 2007 in U.S. Appl. No. 11/045,738.
(Continued)

*Primary Examiner* — Ellen Kim
(74) *Attorney, Agent, or Firm* — Knobbe, Martens, Olson & Bear LLP

(57) ABSTRACT

A package structure and method of packaging for an interferometric modulator. A thin film material is deposited over an interferometric modulator and transparent substrate to encapsulate the interferometric modulator. A gap or cavity between the interferometric modulator and the thin film provides a space in which mechanical parts of the interferometric modulator may move. The gap is created by removal of a sacrificial layer that is deposited over the interferometric modulator.

27 Claims, 8 Drawing Sheets

(56) References Cited

U.S. PATENT DOCUMENTS

| | | |
|---|---|---|
| 3,443,854 A | 5/1969 | Herbert |
| 3,653,741 A | 4/1972 | Alvin |
| 3,656,836 A | 4/1972 | De Cremoux et al. |
| 3,813,265 A | 5/1974 | Marks |
| 3,955,880 A | 5/1976 | Lierke |
| 4,036,360 A | 7/1977 | Deffeyes |
| 4,074,480 A | 2/1978 | Burton |
| 4,099,854 A | 7/1978 | Decker et al. |
| 4,228,437 A | 10/1980 | Shelton |
| 4,310,220 A | 1/1982 | Kuwagaki et al. |
| 4,377,324 A | 3/1983 | Durand et al. |
| 4,383,255 A | 5/1983 | Grandjean et al. |
| 4,389,096 A | 6/1983 | Hori et al. |
| 4,403,248 A | 9/1983 | Te Velde |
| 4,431,691 A | 2/1984 | Greenlee |
| 4,441,791 A | 4/1984 | Hornbeck |
| 4,445,050 A | 4/1984 | Marks |
| 4,459,182 A | 7/1984 | Te Velde |
| 4,482,213 A | 11/1984 | Piliavin et al. |
| 4,500,171 A | 2/1985 | Penz et al. |
| 4,519,676 A | 5/1985 | Te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,662,746 A | 5/1987 | Hornbeck |
| 4,663,083 A | 5/1987 | Marks |
| 4,681,403 A | 7/1987 | Te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,954,789 A | 9/1990 | Sampsell |
| 4,956,619 A | 9/1990 | Hornbeck |
| 4,977,009 A | 12/1990 | Anderson et al. |
| 4,982,184 A | 1/1991 | Kirkwood |
| 5,018,256 A | 5/1991 | Hornbeck |
| 5,022,745 A | 6/1991 | Zayhowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,244,707 A | 9/1993 | Shores |
| 5,254,980 A | 10/1993 | Hendrix et al. |
| 5,268,533 A | 12/1993 | Kovacs et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,296,950 A | 3/1994 | Lin et al. |
| 5,304,419 A | 4/1994 | Shores |
| 5,305,640 A | 4/1994 | Boysel et al. |
| 5,311,360 A | 5/1994 | Bloom et al. |
| 5,312,513 A | 5/1994 | Florence et al. |
| 5,322,161 A | 6/1994 | Shichman et al. |
| 5,323,002 A | 6/1994 | Sampsell et al. |
| 5,325,116 A | 6/1994 | Sampsell |
| 5,327,286 A | 7/1994 | Sampsell et al. |
| 5,331,454 A | 7/1994 | Hornbeck |
| 5,339,116 A | 8/1994 | Urbanus et al. |
| 5,365,283 A | 11/1994 | Doherty et al. |
| 5,381,253 A | 1/1995 | Sharp et al. |
| 5,399,805 A | 3/1995 | Tyler et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,489,952 A | 2/1996 | Gove et al. |
| 5,497,172 A | 3/1996 | Doherty et al. |
| 5,497,197 A | 3/1996 | Gove et al. |
| 5,499,062 A | 3/1996 | Urbanus |
| 5,500,635 A | 3/1996 | Mott |
| 5,500,761 A | 3/1996 | Goossen et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,591,379 A | 1/1997 | Shores |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |
| 5,619,365 A | 4/1997 | Rhoads et al. |
| 5,619,366 A | 4/1997 | Rhoads et al. |
| 5,636,052 A | 6/1997 | Arney et al. |
| 5,646,768 A | 7/1997 | Kaeriyama |
| 5,650,881 A | 7/1997 | Hornbeck |
| 5,654,741 A | 8/1997 | Sampsell et al. |
| 5,657,099 A | 8/1997 | Doherty et al. |
| 5,659,374 A | 8/1997 | Gale, Jr. et al. |
| 5,665,997 A | 9/1997 | Weaver et al. |
| 5,683,591 A | 11/1997 | Offenberg |
| 5,703,710 A | 12/1997 | Brinkman et al. |
| 5,710,656 A | 1/1998 | Goossen |
| 5,717,476 A | 2/1998 | Kanezawa |
| 5,739,945 A | 4/1998 | Tayebati |
| 5,745,193 A | 4/1998 | Urbanus et al. |
| 5,745,281 A | 4/1998 | Yi et al. |
| 5,771,116 A | 6/1998 | Miller et al. |

(56) References Cited

U.S. PATENT DOCUMENTS

| | | |
|---|---|---|
| 5,771,321 A | 6/1998 | Stern |
| 5,777,705 A | 7/1998 | Pierson et al. |
| 5,784,166 A | 7/1998 | Sogard |
| 5,784,189 A | 7/1998 | Bozler et al. |
| 5,784,190 A | 7/1998 | Worley |
| 5,784,212 A | 7/1998 | Hornbeck |
| 5,815,141 A | 9/1998 | Phares |
| 5,818,095 A | 10/1998 | Sampsell |
| 5,825,528 A | 10/1998 | Goossen |
| 5,835,255 A | 11/1998 | Miles |
| 5,837,562 A | 11/1998 | Cho |
| 5,842,088 A | 11/1998 | Thompson |
| 5,853,662 A | 12/1998 | Watanabe |
| 5,856,820 A | 1/1999 | Weigers et al. |
| 5,875,011 A | 2/1999 | Pierson et al. |
| 5,912,758 A | 6/1999 | Knipe et al. |
| 5,936,758 A | 8/1999 | Fisher et al. |
| 5,939,785 A | 8/1999 | Klonis et al. |
| 5,959,763 A | 9/1999 | Bozler et al. |
| 5,986,796 A | 11/1999 | Miles |
| 5,999,306 A | 12/1999 | Atobe et al. |
| 6,028,690 A | 2/2000 | Carter et al. |
| 6,038,056 A | 3/2000 | Florence et al. |
| 6,040,937 A | 3/2000 | Miles |
| 6,049,317 A | 4/2000 | Thompson et al. |
| 6,055,090 A | 4/2000 | Miles |
| 6,061,075 A | 5/2000 | Nelson et al. |
| 6,099,132 A | 8/2000 | Kaeriyama |
| 6,107,115 A | 8/2000 | Atobe et al. |
| 6,113,239 A | 9/2000 | Sampsell et al. |
| 6,120,339 A | 9/2000 | Alwan |
| 6,127,765 A | 10/2000 | Fushinobu |
| 6,147,790 A | 11/2000 | Meier et al. |
| 6,160,833 A | 12/2000 | Floyd et al. |
| 6,180,428 B1 | 1/2001 | Peeters et al. |
| 6,195,196 B1 | 2/2001 | Kimura et al. |
| 6,197,610 B1 | 3/2001 | Toda |
| 6,201,633 B1 | 3/2001 | Peeters et al. |
| 6,232,936 B1 | 5/2001 | Gove et al. |
| 6,238,755 B1 | 5/2001 | Harvey et al. |
| 6,262,696 B1 | 7/2001 | Seraphim et al. |
| 6,282,010 B1 | 8/2001 | Sulzbach et al. |
| 6,284,342 B1 | 9/2001 | Ebisawa et al. |
| 6,295,154 B1 | 9/2001 | Laor et al. |
| 6,297,072 B1 | 10/2001 | Tilmans et al. |
| 6,303,986 B1 | 10/2001 | Shook |
| 6,323,982 B1 | 11/2001 | Hornbeck |
| 6,365,229 B1 | 4/2002 | Robbins |
| 6,379,988 B1 | 4/2002 | Peterson et al. |
| 6,426,124 B2 | 7/2002 | Olster et al. |
| 6,426,461 B1 | 7/2002 | Ginter et al. |
| 6,447,126 B1 | 9/2002 | Hornbeck |
| 6,455,927 B1 | 9/2002 | Glenn et al. |
| 6,462,392 B1 | 10/2002 | Pinter et al. |
| 6,465,355 B1 | 10/2002 | Horsley |
| 6,466,354 B1 | 10/2002 | Gudeman |
| 6,466,358 B2 | 10/2002 | Tew |
| 6,472,739 B1 | 10/2002 | Wood et al. |
| 6,473,274 B1 | 10/2002 | Maimone et al. |
| 6,480,177 B2 | 11/2002 | Doherty et al. |
| 6,489,670 B1 | 12/2002 | Peterson et al. |
| 6,495,895 B1 | 12/2002 | Peterson et al. |
| 6,496,122 B2 | 12/2002 | Sampsell |
| 6,507,385 B1 | 1/2003 | Nishiyama et al. |
| 6,525,416 B2 | 2/2003 | Hauser et al. |
| 6,538,312 B1 | 3/2003 | Peterson et al. |
| 6,545,335 B1 | 4/2003 | Chua et al. |
| 6,548,908 B2 | 4/2003 | Chua et al. |
| 6,549,338 B1 | 4/2003 | Wolverton et al. |
| 6,552,840 B2 | 4/2003 | Knipe |
| 6,558,820 B2 | 5/2003 | Raychaudhuri et al. |
| 6,574,033 B1 | 6/2003 | Chui et al. |
| 6,583,921 B2 | 6/2003 | Nelson |
| 6,589,625 B1 | 7/2003 | Kothari et al. |
| 6,600,201 B2 | 7/2003 | Hartwell et al. |
| 6,603,182 B1 | 8/2003 | Low et al. |
| 6,606,175 B1 | 8/2003 | Sampsell et al. |
| 6,625,047 B2 | 9/2003 | Coleman, Jr. |
| 6,627,814 B1 | 9/2003 | Stark |
| 6,630,786 B2 | 10/2003 | Cummings et al. |
| 6,632,698 B2 | 10/2003 | Ives |
| 6,643,069 B2 | 11/2003 | Dewald |
| 6,650,455 B2 | 11/2003 | Miles |
| 6,661,084 B1 | 12/2003 | Peterson et al. |
| 6,666,561 B1 | 12/2003 | Blakley |
| 6,674,159 B1 | 1/2004 | Peterson et al. |
| 6,674,562 B1 | 1/2004 | Miles et al. |
| 6,680,792 B2 | 1/2004 | Miles |
| 6,690,444 B1 | 2/2004 | Wilkinson et al. |
| 6,710,908 B2 | 3/2004 | Miles et al. |
| 6,741,377 B2 | 5/2004 | Miles |
| 6,741,384 B1 | 5/2004 | Martin et al. |
| 6,741,503 B1 | 5/2004 | Farris et al. |
| 6,747,785 B2 | 6/2004 | Chen et al. |
| 6,775,174 B2 | 8/2004 | Huffman et al. |
| 6,778,046 B2 | 8/2004 | Stafford et al. |
| 6,778,155 B2 | 8/2004 | Doherty et al. |
| 6,779,260 B1 | 8/2004 | Brandenburg et al. |
| 6,794,119 B2 | 9/2004 | Miles |
| 6,811,267 B1 | 11/2004 | Allen et al. |
| 6,819,469 B1 | 11/2004 | Koba |
| 6,822,628 B2 | 11/2004 | Dunphy et al. |
| 6,829,132 B2 | 12/2004 | Martin et al. |
| 6,833,668 B1 | 12/2004 | Yamada et al. |
| 6,843,936 B1 | 1/2005 | Jacobs |
| 6,853,129 B1 | 2/2005 | Cummings et al. |
| 6,855,610 B2 | 2/2005 | Tung et al. |
| 6,859,218 B1 | 2/2005 | Luman et al. |
| 6,861,277 B1 | 3/2005 | Monroe et al. |
| 6,862,022 B2 | 3/2005 | Slupe |
| 6,862,029 B1 | 3/2005 | D'souza et al. |
| 6,867,896 B2 | 3/2005 | Miles |
| 6,870,581 B2 | 3/2005 | Li et al. |
| 6,882,458 B2 | 4/2005 | Lin et al. |
| 6,882,480 B2 | 4/2005 | Yanagisawa |
| 6,912,022 B2 | 6/2005 | Lin et al. |
| 6,914,245 B2 | 7/2005 | Sone et al. |
| 6,940,631 B2 | 9/2005 | Ishikawa |
| 6,947,200 B2 | 9/2005 | Huibers |
| 6,977,391 B2 | 12/2005 | Frischknecht |
| 6,995,890 B2 | 2/2006 | Lin |
| 6,999,225 B2 | 2/2006 | Lin et al. |
| 7,012,732 B2 | 3/2006 | Miles |
| 7,015,885 B2 | 3/2006 | Novotny et al. |
| 7,019,458 B2 | 3/2006 | Yoneda |
| 7,034,984 B2 | 4/2006 | Pan et al. |
| 7,042,643 B2 | 5/2006 | Miles |
| 7,046,374 B1 | 5/2006 | Barbarossa |
| 7,060,895 B2 | 6/2006 | Kothari et al. |
| 7,123,216 B1 | 10/2006 | Miles |
| 7,126,741 B2 | 10/2006 | Wagner et al. |
| 7,153,016 B2 | 12/2006 | Chen |
| 7,161,728 B2 | 1/2007 | Sampsell et al. |
| 7,164,520 B2 | 1/2007 | Palmateer et al. |
| 7,218,438 B2 | 5/2007 | Przybyla et al. |
| 7,307,776 B2 | 12/2007 | Tsai et al. |
| 7,393,712 B2 | 7/2008 | Smith et al. |
| 7,424,198 B2 | 9/2008 | Palmateer et al. |
| 7,443,563 B2 | 10/2008 | Palmateer et al. |
| 7,456,497 B2 | 11/2008 | Higashi |
| 7,470,373 B2 | 12/2008 | Tsai |
| 7,532,385 B2 | 5/2009 | Lin et al. |
| 7,551,246 B2 | 6/2009 | Palmateer |
| 7,978,396 B2 | 7/2011 | Tsai |
| 8,045,835 B2 | 10/2011 | Palmateer et al. |
| 2001/0003487 A1 | 6/2001 | Miles |
| 2001/0004085 A1 | 6/2001 | Gueissaz |
| 2001/0055146 A1 | 12/2001 | Atobe et al. |
| 2002/0012364 A1 | 1/2002 | Kalian et al. |
| 2002/0043706 A1 | 4/2002 | Jerominek et al. |
| 2002/0052392 A1 | 5/2002 | Day et al. |
| 2002/0056898 A1 | 5/2002 | Lopes et al. |
| 2002/0056900 A1 | 5/2002 | Liu et al. |
| 2002/0057565 A1 | 5/2002 | Seo |

(56) References Cited

U.S. PATENT DOCUMENTS

| | | |
|---|---|---|
| 2002/0075551 A1 | 6/2002 | Daneman et al. |
| 2002/0075555 A1 | 6/2002 | Miles |
| 2002/0126364 A1 | 9/2002 | Miles |
| 2002/0160583 A1 | 10/2002 | Song |
| 2002/0187254 A1 | 12/2002 | Ghosh et al. |
| 2003/0043157 A1 | 3/2003 | Miles |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0075794 A1 | 4/2003 | Felton et al. |
| 2003/0108306 A1 | 6/2003 | Whitney et al. |
| 2003/0144034 A1 | 7/2003 | Hack et al. |
| 2003/0147649 A1* | 8/2003 | Nagasaka et al. ............... 398/82 |
| 2003/0152787 A1 | 8/2003 | Arakawa et al. |
| 2003/0161126 A1 | 8/2003 | Wilkinson et al. |
| 2003/0183916 A1 | 10/2003 | Heck et al. |
| 2003/0184412 A1 | 10/2003 | Gorrell |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2004/0051929 A1 | 3/2004 | Sampsell et al. |
| 2004/0058532 A1 | 3/2004 | Miles et al. |
| 2004/0061492 A1 | 4/2004 | Lopes et al. |
| 2004/0076008 A1 | 4/2004 | Ikeda |
| 2004/0080382 A1 | 4/2004 | Nakanishi et al. |
| 2004/0100677 A1 | 5/2004 | Huibers et al. |
| 2004/0126953 A1 | 7/2004 | Cheung |
| 2004/0140557 A1 | 7/2004 | Sun et al. |
| 2004/0145049 A1 | 7/2004 | McKinnell et al. |
| 2004/0147056 A1 | 7/2004 | McKinnell et al. |
| 2004/0150319 A1 | 8/2004 | Tomimatsu et al. |
| 2004/0160143 A1 | 8/2004 | Shreeve et al. |
| 2004/0163472 A1 | 8/2004 | Nagahara |
| 2004/0166606 A1 | 8/2004 | Forehand |
| 2004/0173886 A1 | 9/2004 | Carley |
| 2004/0174583 A1 | 9/2004 | Chen et al. |
| 2004/0179281 A1 | 9/2004 | Reboa |
| 2004/0183990 A1 | 9/2004 | Guang et al. |
| 2004/0184133 A1 | 9/2004 | Su et al. |
| 2004/0212026 A1 | 10/2004 | Van Brocklin et al. |
| 2004/0217378 A1 | 11/2004 | Martin et al. |
| 2004/0217919 A1 | 11/2004 | Piehl et al. |
| 2004/0218251 A1 | 11/2004 | Piehl et al. |
| 2004/0218334 A1 | 11/2004 | Martin et al. |
| 2004/0227493 A1 | 11/2004 | Van Brocklin et al. |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0036095 A1 | 2/2005 | Yeh et al. |
| 2005/0038950 A1 | 2/2005 | Adelmann |
| 2005/0046919 A1 | 3/2005 | Taguchi et al. |
| 2005/0048757 A1 | 3/2005 | Aigner et al. |
| 2005/0057442 A1 | 3/2005 | Way |
| 2005/0068583 A1 | 3/2005 | Gutkowski et al. |
| 2005/0069209 A1 | 3/2005 | Damera-Venkata et al. |
| 2005/0074919 A1 | 4/2005 | Patel et al. |
| 2005/0093134 A1 | 5/2005 | Tarn |
| 2005/0116924 A1 | 6/2005 | Sauvante et al. |
| 2005/0184304 A1 | 8/2005 | Gupta et al. |
| 2005/0195462 A1 | 9/2005 | Lin |
| 2005/0200835 A1 | 9/2005 | Moy et al. |
| 2005/0253283 A1 | 11/2005 | DCamp et al. |
| 2005/0254982 A1 | 11/2005 | Cadeddu |
| 2005/0275079 A1 | 12/2005 | Stark |
| 2006/0029732 A1 | 2/2006 | Kobrin et al. |
| 2006/0146426 A1* | 7/2006 | Chen et al. ............... 359/820 |
| 2006/0274400 A1 | 12/2006 | Miles |
| 2009/0219605 A1 | 9/2009 | Lin et al. |
| 2011/0059275 A1 | 3/2011 | Stark |
| 2011/0097845 A1 | 4/2011 | Ables et al. |

FOREIGN PATENT DOCUMENTS

| | | |
|---|---|---|
| EP | 0667548 A1 | 8/1995 |
| EP | 0695959 A1 | 2/1996 |
| EP | 0822570 A2 | 2/1998 |
| EP | 1418154 A2 | 5/2004 |
| EP | 1433742 A2 | 6/2004 |
| FR | 2841380 | 12/2003 |
| JP | 61206244 | 9/1986 |
| JP | 63162378 U | 10/1988 |
| JP | 2068513 A | 3/1990 |
| JP | 3199920 A | 8/1991 |
| JP | 08162006 | 6/1996 |
| JP | 10070287 | 3/1998 |
| JP | 11337953 | 12/1999 |
| JP | 2001318324 | 11/2001 |
| JP | 2001351998 | 12/2001 |
| JP | 2002062491 | 2/2002 |
| JP | 2002062492 | 2/2002 |
| JP | 2002258310 | 9/2002 |
| JP | 2002296519 | 10/2002 |
| JP | 2002312066 | 10/2002 |
| JP | 2002328313 A | 11/2002 |
| JP | 2002538512 A | 11/2002 |
| JP | 2002357846 | 12/2002 |
| JP | 2003075741 | 3/2003 |
| JP | 2003233024 | 8/2003 |
| JP | 2003330001 | 11/2003 |
| JP | 2004053852 A | 2/2004 |
| JP | 200478107 | 3/2004 |
| JP | 2004118001 | 4/2004 |
| JP | 2004170507 A | 6/2004 |
| TW | 200409980 | 6/2004 |
| WO | WO-9005795 A1 | 5/1990 |
| WO | WO-9428452 A1 | 12/1994 |
| WO | WO-9501624 A1 | 1/1995 |
| WO | WO-9806118 A1 | 2/1998 |
| WO | WO-9941732 A2 | 8/1999 |
| WO | WO-0016105 A1 | 3/2000 |
| WO | WO-0017695 A1 | 3/2000 |
| WO | WO-0052674 A1 | 9/2000 |
| WO | WO-0145140 A2 | 6/2001 |
| WO | WO-0158804 A2 | 8/2001 |
| WO | WO-0192842 A2 | 12/2001 |
| WO | WO-0242716 | 5/2002 |
| WO | WO-03023849 A1 | 3/2003 |
| WO | WO-03026369 A1 | 3/2003 |
| WO | WO-03054925 A2 | 7/2003 |
| WO | WO-03070625 A2 | 8/2003 |
| WO | WO-03084861 A2 | 10/2003 |
| WO | WO-03095706 A2 | 11/2003 |
| WO | WO-03105198 A1 | 12/2003 |
| WO | WO-2004077523 A2 | 9/2004 |
| WO | WO-2005066596 A1 | 7/2005 |

OTHER PUBLICATIONS

Office Action dated Oct. 19, 2007 in U.S. Appl. No. 11/045,738.
Office Action dated Nov. 15, 2007 in U.S. Appl. No. 11/045,738.
Office Action in Chinese Appl. No. 200510102599.0, Apr. 4, 2008.
Office Action in Chinese Appl. No. 20051012599.0, Jan. 9, 2009.
Decision of Rejection in Chinese Appl. No. 200510102599.0, Jul. 24, 2009.
Office Action dated May 29, 2009 in U.S. Appl. No. 12/192,908.
Office Action dated Nov. 30, 2009 in U.S. Appl. No. 12/192,908.
Office Action dated Jan. 10, 2011 in U.S. Appl. No. 12/192,908.
Notice of Reasons for Rejection dated May 24, 2011 in Japanese Appl. No. 2005-218816.
Office Action dated Nov. 15, 2011 in Chinese App. No. 201110053331.8.
Notice to Submit a Response dated Feb. 8, 2012 in Korean App. No. 10-2011-0140059.
Office Action dated Aug. 3, 2012 in Chinese App. No. 201110053331.8.
Akasaka Y., "Three-Dimensional IC Trends," Proceedings of IEEE, 1986, vol. 74 (12), pp. 1703-1714.
Aratani K, et al., "Process and Design Considerations for Surface

(56) References Cited

OTHER PUBLICATIONS

Micromachined Beams for a Tuneable Interferometer Array in Silicon," Proc. IEEE Microelectromechanical workshop fort Lauderdale FL, 1993, 230-235.
Aratani K. et al., "Surface Micromachined Tuneable Interferometer Array," Sensors and Actuators A, Elsevier Sequoia S.A., Lausanne, CH, A, 1993, 43(1/3), 17-23.
Ashurst, et al., "Vapor-Phase Anti-Stiction Coatings for MEMS," IEEE transactions of Device and materials reliability, Dec. 2003, vol. 3, No. 4, pp. 173-178.
Conner, "Hybrid Color Display using Optical Interference Filter Array," SID Digest, 1993, 577-580.
Extended European Search Report dated Oct. 21, 2008 in App. No. 05255702.2.
Goossen, et al., "Silicon Modulator Based on Mechnically-Active Anti-Reflection Layer With 1Mbit/Sec Capability for Fiber-In-The-Loop Applications," IEEE Photonics Technology Letters, 1994, 1119-1121.
Goossen K.W. et al., "Possible Display Applications of the Silicon Mechanical Antireflection Switch," Society for Information Display, 1994.
Gosch, "West Germany Grabs the Lead in X-Ray Lithography," Electronics, 1987, 78-80.
Greco, et al., "Optical Properties of IPN-like Networks Polyethylene/ Poly (Butylmethacrylate-Co-Styrene) Copolymer Systems," Influence of Copolymer Crosslinkers, Polymer, vol. 42(12), p. 5089-5095, 2001.
Howard, et al., "Nanometer-Scale Fabrication Techniques," VLSI Electronics: Microstructure Science, 1982, vol. 5, 145-153, 166-173.
Jackson, "Classical Electrodynamics," John Wiley & Sons Inc, 1962, pp. 568-573.
Jerman et al., "A Miniature Fabry-Perot Interferometer with a Corrugated Silicon Diaphragm Support", IEEE Electron Devices Society, pp. 140-144, 1990.
Johnson, "Optical Scanners," Microwave Scanning Antennas, 1964, vol. 1(2), 251-261.
Liang, et al., "A Low Temperature Wafer-Level Hermetic Mems Package using UV Curable Adhesive," IEEE Electronic Components and Technology Conference, 2004, pp. 1486-1491.
Light Over Matter Circle No. 36, Jun. 1993.
Maboudian, et al., "Self-Assembled Monolayers as Anti-Stiction Coatings for MEMS: Characteristics and Recent Developments," Sensors and Actuators, 2000, 82, 219-223.

Miles M.W., "A New Reflective FPD Technology using Interferometric Modulation," Journal of the SID, 1997, vol. 5(4), 379-382.
Miles M.W., et al., "Interferometric Modulation MEMS as an enabling technology for high-performance reflective displays," Proceedings of the SPIE, 2003, 4985, 131-139.
Miles M.W., "MEMS-Based Interferometric Modulator for Display Applications," Proceedings of SPIE Conference on Micromachined Devices and Components V, Sep. 1999, SPIE vol. 3876, pp. 20-28.
Moraja, et al., "Advanced Getter Solutions at Wafer Level to Assure High Reliability to the Last Generations MEMS," IEEE 41st Annual International Reliability Physics Symposium, Dallas, TX, 2003, pp. 458-459.
Newsbreaks, "Quantum-trench devices might operated at terahertz frequencies", Laser Focus World, May 1993.
Oliner, "Radiating Elements and Mutual Coupling," Microwave Scanning Antennas, 1966, vol. 2, 131-157 and pp. 190-194.
Raley, et al., "A Fabry-Perot Microinterferometer for Visible Wavelengths," IEEE Solid-State Sensor and Actuator Workshop, 1992, 170-173.
Sparks, et al., "Chip-Level Vacuum Packaging of Micromachines using NanoGetters," IEEE Transactions on Advanced Packaging,] Aug. 2003, vol. 6 Issue 3, pp. 277-282.
Sperger, et al., "High Performance Patterned All-Dielectric Interference Colour Filter for Display Applications," SID Digest, 1994, 81-83.
Stark, et al., "An Integrated Process for Post-Packaging Release and Vacuum Sealing of Electroplated Nickel Packages Transducers," 12th International Conference on Solid-State Sensors, Actuators and Microsystems, 2003, pp. 1911-1914.
Stone J.M., "Radiation and Optics, An Introduction to the Classic Theory," 1963, McGraw-Hill, pp. 340-343.
Tilmans, et al., "The Indent Reflow Sealing (IRS) Technique—A Method for the Fabrication of Sealed Cavities for Mems Devices," Journal of Microelectromechanical Systems, Jun. 2000, vol. 9(2), 206-217.
Walker, et al., "Electron-Beam-Tunable Interference Filter Spatial Light Modulator," Optics Letters, 1988, vol. 13(5), 345-347.
Winton et al., "A novel way to capture solar energy," Chemical Week, pp. 17-18 (May 15, 1985).
Wu, et al., "Design of a Reflective Color LCD using Optical Interference Reflectors," Asia Display, Changchun Institute of Physics, 1995, 929-931.

\* cited by examiner

METHOD AND DEVICE FOR PACKAGING A SUBSTRATE

CROSS-REFERENCE TO RELATED APPLICATIONS

This application is a continuation of U.S. application Ser. No. 12/192,908, filed on Aug. 15, 2008, which is a continuation of U.S. application Ser. No. 11/045,738, filed Jan. 28, 2005, now U.S. Pat. No. 7,424,198, which claims priority to U.S. Provisional Application No. 60/613,318, filed Sep. 27, 2004, the contents of each of which are hereby incorporated by reference in their entirety.

BACKGROUND

1. Field of the Invention

The field of the invention relates to microelectromechanical systems (MEMS) and the packaging of such systems. More specifically, the field of the invention relates to interferometric modulators and methods of fabricating such modulators with thin film backplanes.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. An interferometric modulator may comprise a pair of conductive plates, one or both of which may be transparent and/or reflective in whole or part and capable of relative motion upon application of an appropriate electrical signal. One plate may comprise a stationary layer deposited on a substrate, the other plate may comprise a metallic membrane separated from the stationary layer by an air gap. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

An embodiment provides a package structure for an interferometric modulator display device that eliminates the need for a separate backplane, desiccant, and seal. The display device includes a transparent substrate, an interferometric modulator configured to modulate light transmitted through the transparent substrate, and a thin film backplane disposed on the modulator and sealing the modulator within a package between the transparent substrate and the thin film backplane. A gap exists between the modulator and the thin film and is created by the removal of a sacrificial layer.

In accordance with another embodiment, a method of manufacturing a display device is provided. According to this method, a transparent substrate is provided and an interferometric modulator is formed on the transparent substrate. A thin film backplane is then deposited over the interferometric modulator and the transparent substrate to seal the modulator between the transparent substrate and the thin film backplane. A sacrificial layer is deposited on the interferometric modulator prior to deposition of the thin film backplane. The sacrificial layer is removed after deposition of the thin film backplane to create a gap between said interferometric modulator and the thin film backplane.

In accordance with yet another embodiment, a microelectromechanical systems display device is provided, comprising a transparent substrate, an interferometric modulator formed on the transparent substrate, and a thin film backplane sealed to the transparent substrate to encapsulate the interferometric modulator between the transparent substrate and the thin film backplane. A cavity exists between the interferometric modulator and the thin film backplane. The cavity is created by removing a sacrificial layer between the interferometric modulator and the thin film backplane.

According to another embodiment, a display device is provided, comprising a transparent substrate, an interferometric modulator, a thin film backplane deposited over the interferometric modulator, and a cavity between the modulator and the thin film backplane. The interferometric modulator is configured to modulate light transmitted through the transparent substrate, and is formed on the transparent substrate. The thin film backplane is deposited over the interferometric modulator to seal the modulator within a package between the transparent substrate and the thin film backplane. The cavity is formed by removing a sacrificial material.

According to yet another embodiment, a display device is provided. The display device includes a transmitting means for transmitting light therethrough, a modulating means configured to modulating light transmitted through the transmitting means, and a sealing means for sealing the modulating means within a package between the transmitting means and the sealing means. The modulating means comprises an interferometric modulator, and the sealing means comprises a thin film.

BRIEF DESCRIPTION OF THE DRAWINGS

These and other aspects of the invention will be readily apparent from the following description and from the appended drawings (not to scale), which are meant to illustrate and not to limit the invention, and wherein.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the invention may be implemented in any device that is configured to display an image, whether in motion (e.g., video) or stationary (e.g., still image), and whether textual or pictorial. More particularly, it is contemplated that the invention may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Figure 1:
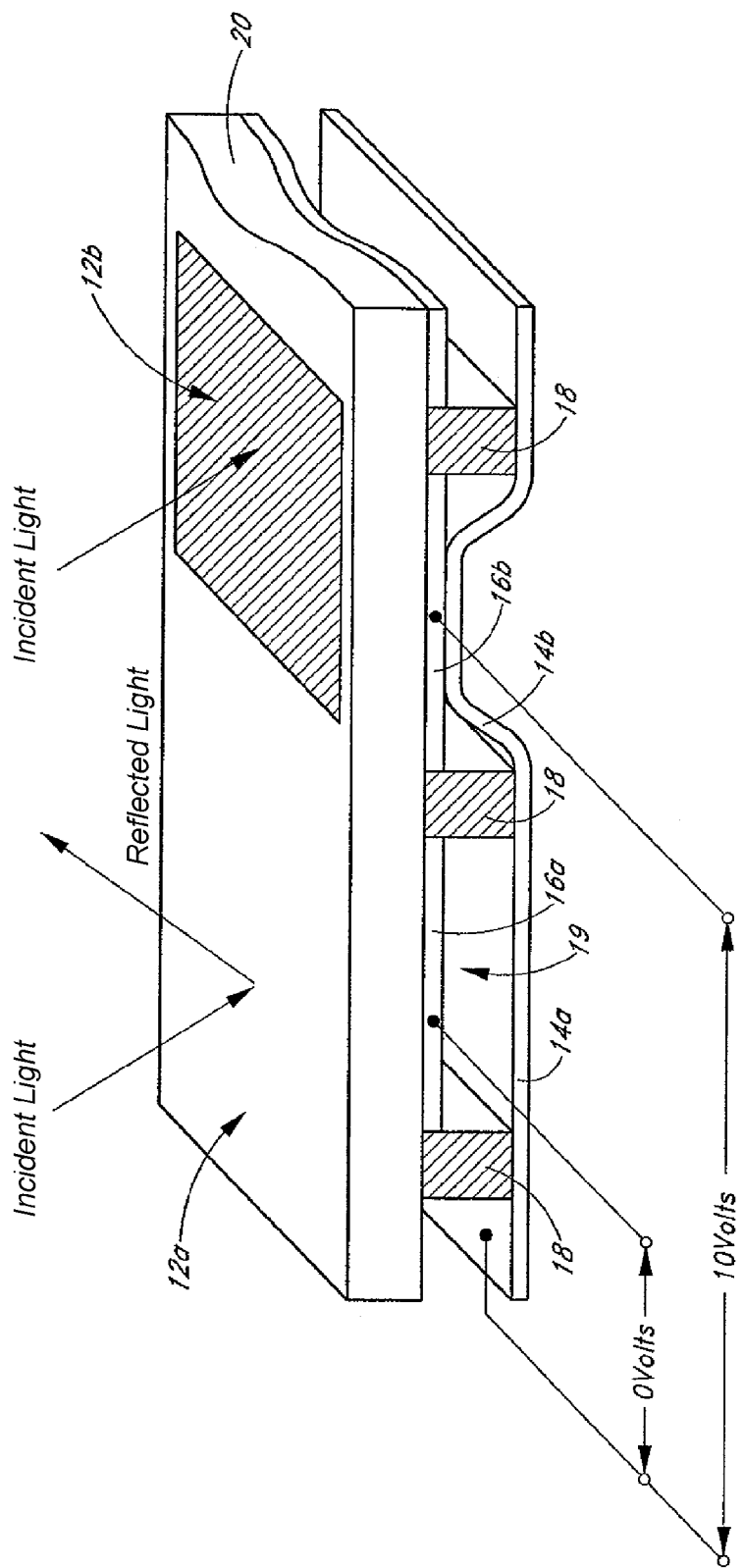
FIG. 1 is an isometric view depicting a portion of one embodiment of an interferometric modulator display in which a movable reflective layer of a first interferometric modulator is in a released position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the released state, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and highly reflective layer 14a is illustrated in a released position at a predetermined distance from a fixed partially reflective layer 16a. In the interferometric modulator 12b on the right, the movable highly reflective layer 14b is illustrated in an actuated position adjacent to the fixed partially reflective layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers are separated from the fixed metal layers by a defined air gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

Figure 2:
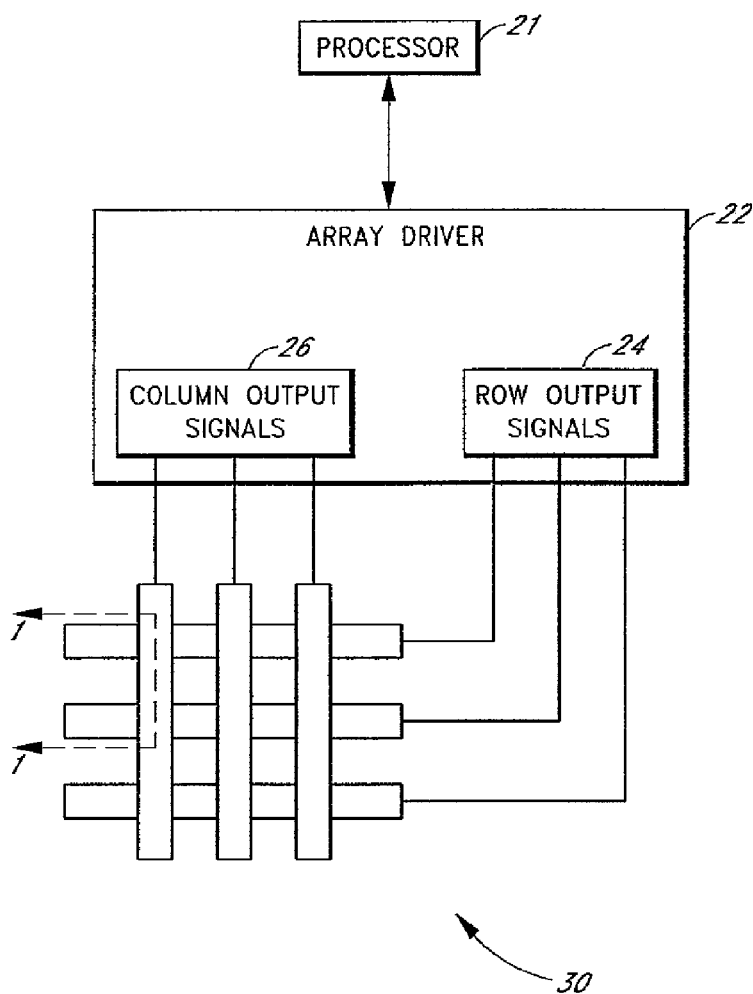
FIG. 2 is a system block diagram illustrating one embodiment of an electronic device incorporating a 3×3 interferometric modulator display.

FIGS. 2 through 5 illustrate one exemplary process and system for using an array of interferometric modulators in a display application. FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a pixel array 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the released state to the actuated state. However, when the voltage is reduced from that value, the movable layer maintains its state as the voltage drops back below 10 volts. In the exemplary embodiment of FIG. 3, the movable layer does not release completely until the voltage drops below 2 volts. There is thus a range of voltage, about 3 to 7 V in the example illustrated in FIG. 3, where there exists a window of applied voltage within which the device is stable in either the released or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be released are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or released pre-existing state. Since each pixel of the interferometric modulator, whether in the actuated or released state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
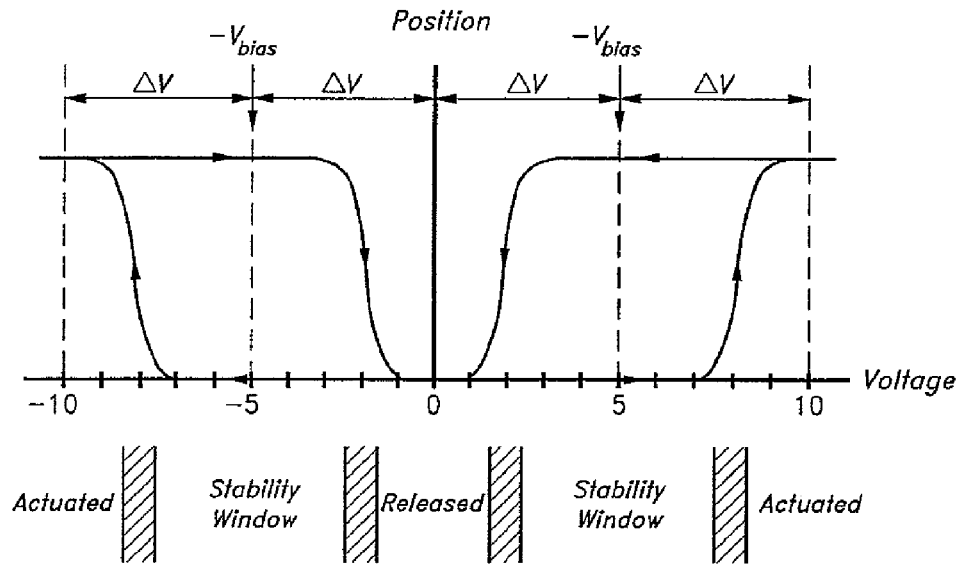
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Releasing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$.

Figure 5A:
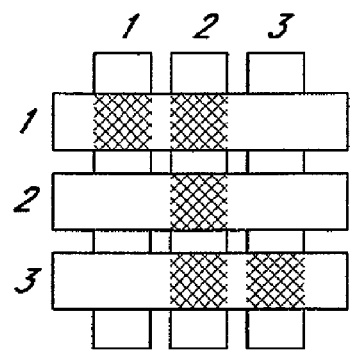
FIGS. 5A and 5B illustrate one exemplary timing diagram for row and column signals that may be used to write a frame of display data to the 3×3 interferometric modulator display of FIG. 2.
Figure 5B:
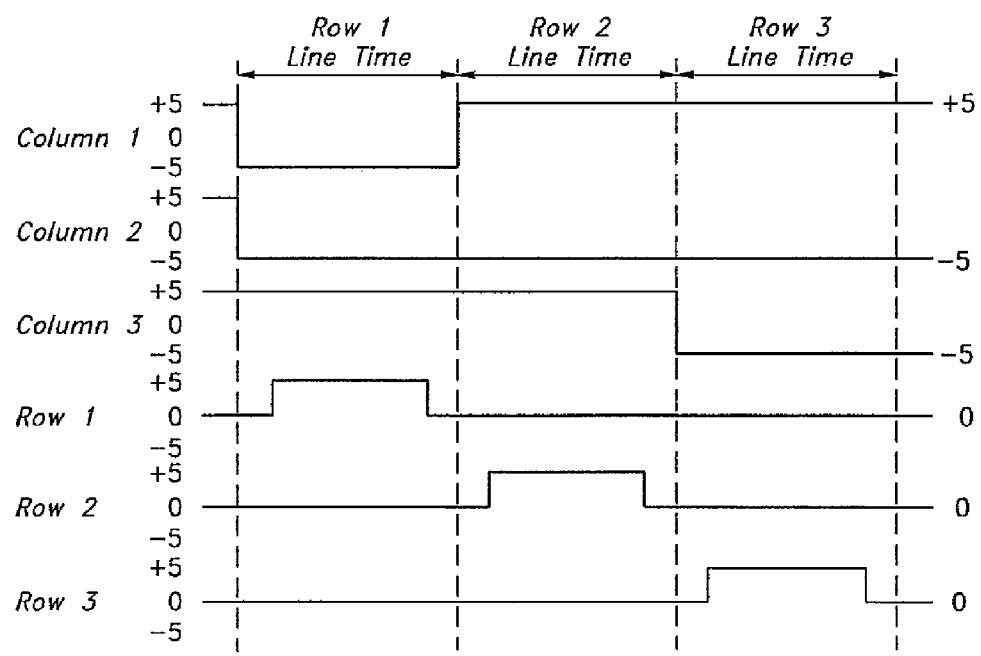

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or released states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and releases the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and release pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the present invention.

Figure 6A:
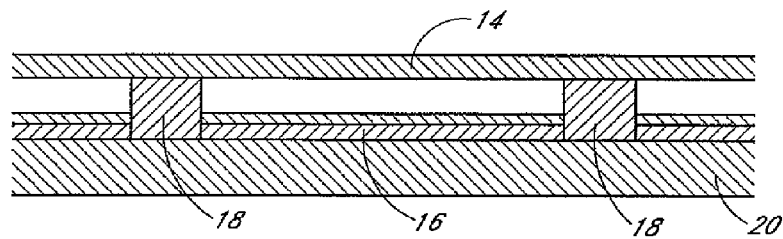
FIG. 6A is a cross section of the device of FIG. 1.
Figure 6B:
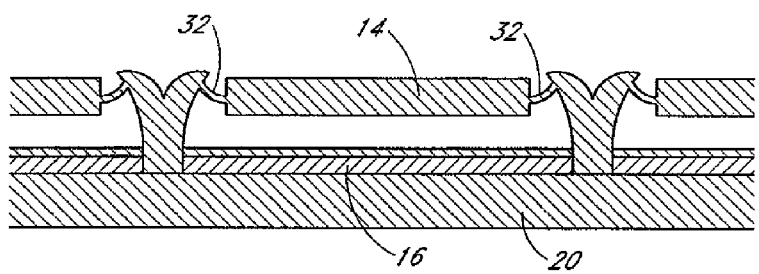
FIG. 6B is a cross section of an alternative embodiment of an interferometric modulator.
Figure 6C:
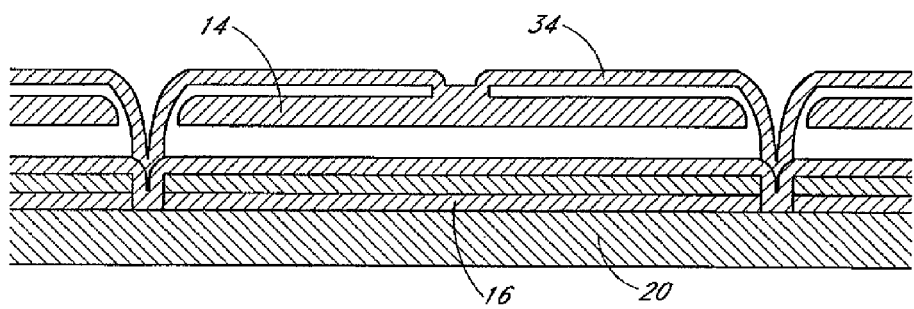
FIG. 6C is a cross section of another alternative embodiment of an interferometric modulator.

The details of the structure of interferometric modulators that operate in accordance with the principles set forth above may vary widely. For example, FIGS. 6A-6C illustrate three different embodiments of the moving mirror structure. FIG. 6A is a cross section of the embodiment of FIG. 1, where a strip of metal material 14 is deposited on orthogonally extending supports 18. In FIG. 6B, the moveable reflective material 14 is attached to supports at the corners only, on tethers 32. In FIG. 6C, the moveable reflective material 14 is suspended from a deformable layer 34. This embodiment has benefits because the structural design and materials used for the reflective material 14 can be optimized with respect to the optical properties, and the structural design and materials used for the deformable layer 34 can be optimized with respect to desired mechanical properties. The production of various types of interferometric devices is described in a variety of published documents, including, for example, U.S. Published Application 2004/0051929. A wide variety of well known techniques may be used to produce the above described structures involving a series of material deposition, patterning, and etching steps.

Figure 7:
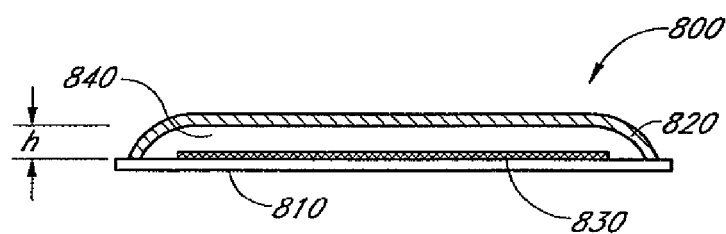
FIG. 7 schematically illustrates a package structure in which an interferometric modulator is packaged without a conventional backplane, according to an embodiment.

FIG. 7 illustrates a package structure 800 in which an interferometric modulator 830 is packaged on a transparent substrate 810 without a conventional backplane or cap. The package structure 800 illustrated in FIG. 7 may eliminate the need for not only a backplane but also a separate seal as well as a desiccant.

In accordance with the embodiment shown in FIG. 7, instead of sealing a backplane to the transparent substrate to encapsulate the interferometric modulator 830, as discussed above, a thin film or superstructure 820 is deposited over the transparent substrate 810 to encapsulate the interferometric modulator 830 within the package structure 800. The thin film 820 protects the interferometric modulator 830 from harmful elements in the environment.

A method of packaging an interferometric modulator according to the embodiment shown in FIG. 7 will be discussed in more detail below. The packages and packaging methods described herein may be used for packaging any interferometric modulator, including, but not limited to, the interferometric modulators described above.

As discussed above, the interferometric modulator 830 is configured to reflect light through the transparent substrate and includes moving parts, such as the movable mirrors 14a, 14b. Therefore, to allow such moving parts to move, a gap or cavity 840 is preferably created between such moving parts and the thin film 820. The gap or cavity 840 allows the mechanical parts, such as the movable mirrors 14a, 14b, of the interferometric modulator 830 to move. It will be understood that before the thin film 820 can be deposited to encapsulate the interferometric modulator 830, a sacrificial layer 850 (shown in FIG. 9) is preferably deposited over the interferometric modulator 830 and the transparent substrate 810, and then removed, to create a cavity 840 between the interferometric modulator 830 and the thin film 820. This will be described in more detail below.

Figure 8:
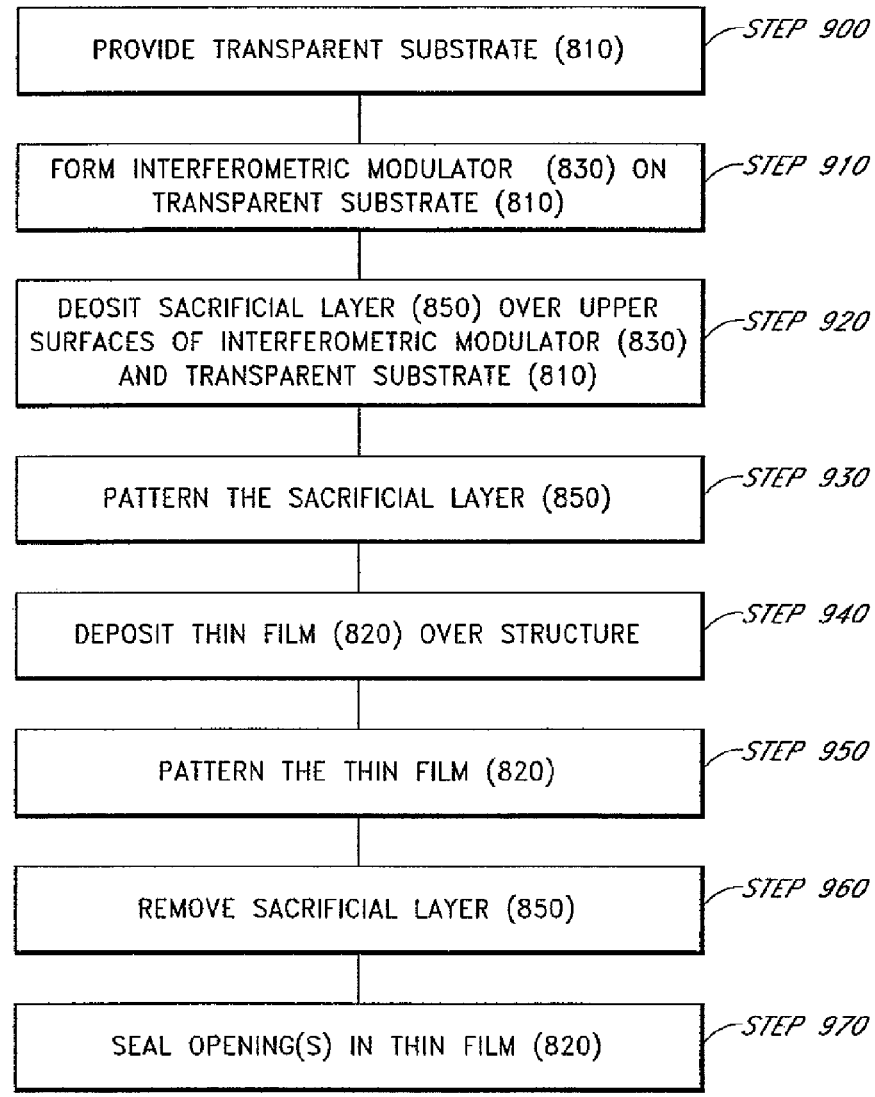
FIG. 8 is a flow chart of an embodiment of a method to package interferometric modulators.

FIG. 8 shows one embodiment of a method of packaging an interferometric modulator without a conventional backplane or cap. A transparent substrate 810 is first provided at Step 900 and the interferometric modulator 830 is formed on the transparent substrate 810 at Step 910. The interferometric modulator 830 is preferably formed in accordance with the processes described with reference to FIGS. 1-6. The transparent substrate 810 may be any transparent substance capable of having thin film, MEMS devices built upon it. Such transparent substances include, but are not limited to, glass, plastic, and transparent polymers. Images are displayed through the transparent substrate 810, which serves as an imaging surface.

After the interferometric modulator 830 has been formed on the transparent substrate 810, a sacrificial layer 850 is preferably deposited over the upper surfaces of the interferometric modulator 830 and the transparent substrate 810 in Step 920. The sacrificial layer 850 is then patterned in Step 930, using photolithographic techniques. This patterning process preferably localizes the sacrificial layer 850 to the interferometric modulator 830, exposing the transparent substrate 810 around the periphery of the interferometric modulator 830. After the sacrificial layer 850 has been deposited and patterned, a thin film 820 is then deposited over the entire structure, in Step 940. The thin film 820 is then patterned in Step 950, using photolithographic techniques. This patterning process localizes the thin film 820 to the sacrificial layer 850. This patterning step also provides features in the thin film 820 that enable the subsequent removal of the sacrificial layer 850. It should be noted that, at this point in the process, additional sacrificial layers may or may not remain within the interferometric modulator structure. The patterning step 930 allows for removal of sacrificial layer 850 as well as for removal of any sacrificial layers remaining within the interferometric modulator 830. In Step 960, the sacrificial layer 850 and any sacrificial layers within the interferometric modulator 830 are removed, leaving a cavity 840 between the interferometric modulator 830 and the thin film 820, completing processing of the interferometric modulator 830. In Step 970, the features or openings in the thin film 820 are sealed.

In accordance with an embodiment, an interferometric modulator 830 is preferably formed on a transparent substrate 810. It will be understood that the fixed mirrors 16a, 16b of the interferometric modulator 830 are adjacent the transparent substrate 810 and the movable mirrors 14a, 14b are formed over the fixed mirrors 16a, 16b such that the movable mirrors 14a, 14b may move within the cavity 840 of the package structure of the embodiment shown in FIG. 7.

To form the interferometric modulator 830, the transparent substrate 810 in one embodiment is covered with indium tin oxide (ITO). The ITO may be deposited by standard deposition techniques, including chemical vapor deposition (CVD) and sputtering, preferably to a thickness of about 500 Å. A relatively thin layer of chrome is preferably deposited over the ITO. The ITO/chrome bilayer is then etched and patterned into columns to form the column electrodes 16a, 16b. A layer of silicon dioxide ($SiO_2$) is preferably formed over the ITO/chrome columns to create partially reflective fixed mirrors 16a, 16b. A sacrificial layer of silicon (Si) is preferably deposited (and later released) over the structure to create a resonant optical cavity between the fixed mirrors 16a, 16b and the movable mirrors 14a, 14b. In other embodiments, this sacrificial layer may be formed of molybdenum (Mo), tungsten (W), or titanium (Ti).

Another mirror layer, preferably formed of aluminum, is deposited over the sacrificial layer of silicon to form the movable mirrors 14a, 14b of the interferometric modulator 830. This mirror layer is deposited and patterned into rows orthogonal to the column electrodes 16a, 16b to create the row/column array described above. In other embodiments, this mirror layer may comprise highly reflective metals, such as, for example, silver (Ag) or gold (Au). Alternatively, this mirror layer may be a stack of metals configured to give the proper optical and mechanical properties.

The sacrificial layer of silicon is removed, preferably using a gas etching process, after the movable mirrors 14a, 14b are formed to create the optical cavity between the fixed mirrors 16a, 16b and the movable mirrors 14a, 14b. In an embodiment, this sacrificial layer is etched away after the thin film 820 is formed. Standard etching techniques may be used to remove the sacrificial layer of silicon. The particular release etching will depend on the material to be released. For example, xenon diflouride ($XeF_2$) may be used to remove the silicon sacrificial layer. In one embodiment, the sacrificial layer of silicon between the mirrors 16a, 16b, 14a, 14b is removed after the thin film 820 is formed. The skilled artisan will appreciate that each layer of the interferometric modulator 830 is preferably deposited and patterned using standard deposition techniques and standard photolithographic techniques.

Figure 9:
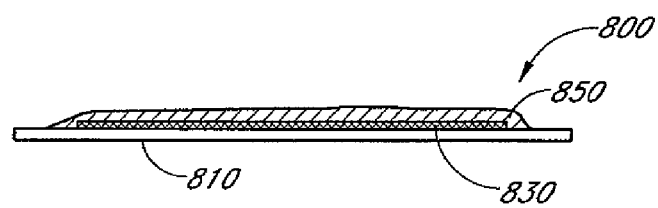
FIG. 9 schematically illustrates a package structure in which a sacrificial layer has been deposited over the interferometric modulator, according to an embodiment.

As shown in FIG. 9, after the interferometric modulator 830 is formed on the transparent substrate 810, another sacrificial layer 850 is deposited over the upper surfaces of the interferometric modulator 830 and the transparent substrate 810. The sacrificial layer 850 may be formed of a material, such as, for example, molybdenum (Mo), silicon (Si), tungsten (W), or titanium (Ti), which is capable of being released after deposition of the thin film 820. In an embodiment, the sacrificial layer 850 is formed of a material, such as a polymer, spin-on glass, or oxide. The removal processes, which may differ depending on the material of the sacrificial layer, will be described in more detail below.

The skilled artisan will appreciate that the upper sacrificial layer 850 may be formed of any of molybdenum (Mo), silicon (Si), tungsten (W), titanium (Ti), polymer, spin-on glass, or oxide so long as the material provides sufficient step coverage and can be deposited to the desired thickness. The thickness of the sacrificial layer 850 should be sufficient to separate the thin film 820 and the interferometric modulator 830. In one embodiment, the upper sacrificial layer 850 is deposited to a thickness in the range of about 1000 Å to 1 µm, and more preferably in a range of about 1000 Å to 5000 Å. In one embodiment, the sacrificial layer 850 is patterned and etched using standard photolithographic techniques.

Figure 10:
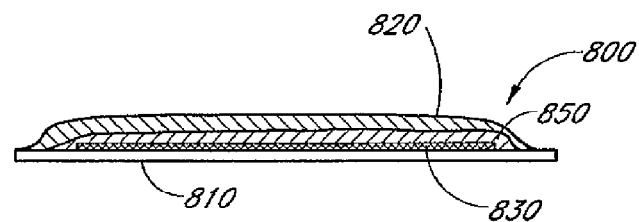
FIG. 10 schematically illustrates a package structure in a thin film has been deposited over the sacrificial layer.

In one embodiment, the thin film 820 can be deposited over the entire upper surface of the sacrificial layer 850, as shown in FIG. 10. The thin film 820 may be formed over the sacrificial layer 850 using known deposition techniques. After the thin film 820 is patterned and etched, the sacrificial layer 850 is released to form a cavity 840 in which the movable mirrors 14a, 14b may move, as shown in FIG. 8.

The thin film 820 is preferably patterned and etched to form at least one opening therein through which a release material, such as xenon diflouride ($XeF_2$), may be introduced into the interior of the package structure 800 to release the sacrificial layer 850. The number and size of these openings depend on the desired rate of release of the sacrificial layer 850. The openings may be positioned anywhere in the thin film 820. In certain embodiments, the sacrificial layer 850 and the sacrificial layer within the interferometric modulator (between the fixed mirrors 16a, 16b and the movable mirrors 14a, 14b) may be released at the same time. In other embodiments, the sacrificial layer 850 and the sacrificial layer within the interferometric modulator are not removed at the same time, with the sacrificial layer 850 being removed prior to the removal of the sacrificial layer within the interferometric modulator.

Figure 11:
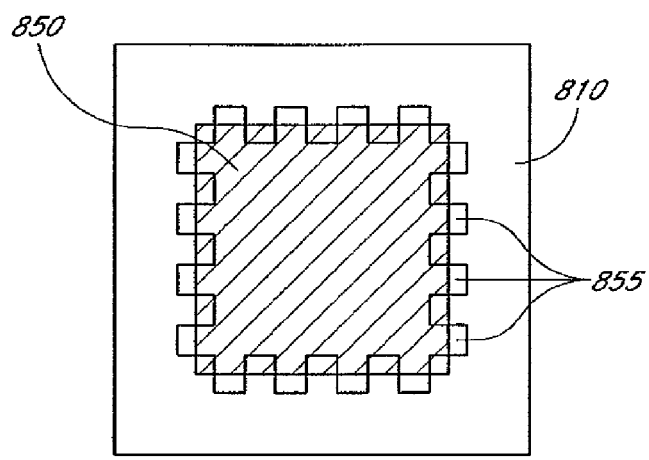
FIG. 11 is a top view of an embodiment of the package structure 800 after the thin film 820 has been deposited and patterned and before the sacrificial layer 850 is released.

An alternative release technique is shown by the embodiment in FIG. 11. FIG. 11 is a top view of an embodiment of the package structure 800 after the thin film 820 has been deposited and patterned and before the sacrificial layer 850 is released. As shown in FIG. 11, the sacrificial layer 850 is deposited and patterned such that it has a plurality of protrusions 855. The thin film 820 is then deposited over the sacrificial layer 850 and the transparent substrate 810. After the thin film 820 is deposited, it is then preferably etched back on each side, as shown in FIG. 11. The package structure 800 can then be exposed to the release material, such as xenon diflouride ($XeF_2$), which reacts first with the exposed sacrificial layer 850 material and then enters the package structure 800 through the openings created at the protrusions 855 by the removal of the sacrificial layer 850 on the sides of the package structure. It will be understood that the number and size of the protrusions 855 will depend on the desired rate of release of the sacrificial layer 850.

To remove a sacrificial layer of molybdenum (Mo), silicon (Si), tungsten (W), or titanium (Ti), xenon difluoride ($XeF_2$) may be introduced into the interior of the package structure 800 through an opening or openings in the thin film 820. Such openings in the thin film 820 are preferably created by etching an opening in the thin film 820. The xenon diflouride ($XeF_2$) reacts with the sacrificial layer 850 to remove it, leaving a cavity 840 between the interferometric modulator 830 and the thin film 820. A sacrificial layer 850 formed of spin-on glass or oxide is preferably gas etched or vapor phase etched to remove the sacrificial layer 850 after the thin film 820 has been deposited. The skilled artisan will appreciate that the removal process will depend on the material of the sacrificial layer 850.

The skilled artisan will also appreciate that the cavity 840 is necessary behind the interferometric modulator 830 to allow the mechanical parts, such as the movable mirrors 14a, 14b, of the interferometric modulator 830 to be free to move. The resulting height h of the cavity 840 depends on the thickness of the sacrificial layer 850.

In some embodiments, the thin film 820 may be any type of material that is hermetic or hydrophobic, including, but not limited to, nickel, aluminum, and other types of metals and foils. The thin film 820 may also be formed of an insulator, including, but not limited to, silicon dioxide, aluminum oxide, or nitrides.

Figure 12:
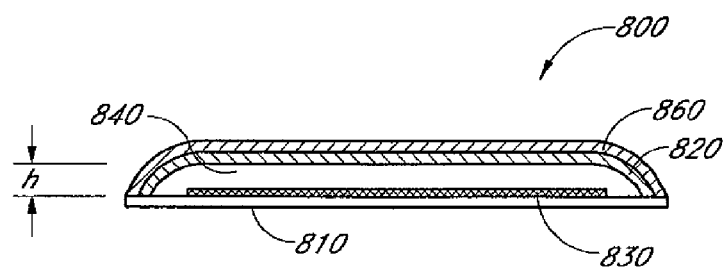
FIG. 12 schematically illustrates a package structure in which an interferometric modulator is packaged according to an embodiment and having an overcoat layer.

Alternatively, the thin film 820 may be formed of a non-hermetic material. Suitable non-hermetic materials include polymers, such as, for example, PMMA, epoxies, and organic or inorganic spin-on glass (SOG) type materials. If non-hermetic materials are used for the thin film 820, an overcoat layer 860, as shown in FIG. 12, is preferably formed over the non-hermetic thin film to provide additional protection to the interferometric modulator 830 after the sacrificial layer 850 is removed, as shown in FIG. 12. Such an overcoat layer 860 is preferably formed of a vapor barrier and has a thickness of about 1000 Å to about 10,000 Å. In one embodiment, the overcoat layer 860 is Barix™, a thin film coating commercially available from Vitex Systems, Inc. in San Jose, Calif. Such an overcoat may be multi-layered in which some layers may serve gas hermeticity purposes, and some layers, as described below, may serve mechanical purposes.

In certain embodiments in which the thin film 820 is a hydrophobic material, it does not necessarily create a hermetic seal, but may nevertheless eliminate the need for a conventional backplane. It will be appreciated that any further moisture barrier required can be incorporated in the next step of packaging at the module level.

The thin film 820 can be deposited by chemical vapor deposition (CVD) or other suitable deposition methods to a thickness of about 1 µm. The skilled artisan will understand that the thickness of the thin film 820 may depend on the particular material properties of the material selected for the thin film 820.

The thin film 820 may be either transparent or opaque. Because images are not displayed through the thin film 820, but rather through the transparent substrate 810, it is understood that the thin film 820 need not be transparent. The skilled artisan will appreciate that transparent materials, such as spin-on glass, may be used to form the thin film 820 as they may have material properties that are suitable for use as a thin film 820 for protection of the interferometric modulator 830. For example, a material such as spin-on glass, which is transparent, may provide more strength and protection to the interferometric modulator 830 within the package structure 800.

After the sacrificial layer 850 is released, the opening(s) in the thin film 820 are preferably sealed. In an embodiment, epoxy is used to seal these openings. The skilled artisan will appreciate that other materials may be used as well and that materials having high viscosity are preferred. If the openings are sufficiently small (e.g., less than 1µ), another layer of the thin film 820 material may be used to seal the openings.

In some embodiments, including, but not limited to, certain embodiments having a hermetic thin film 820, an overcoat layer 860 may be deposited over the thin film 820 after the sacrificial layer 850 has been removed, as shown in FIG. 12. The overcoat layer is preferably formed of a polymer and preferably has a thickness of about 1 µm to several millimeters. The overcoat layer 860 provides additional strength and stiffness to the thin film 820. In certain embodiments where the opening(s) in the thin film 820 are sufficiently small (e.g., less than 1μ), the overcoat layer 860 may be used to seal the openings rather than another layer of the thin film 820, as described above.

The thin film 820 preferably hermetically seals the interior the package structure 800 from the ambient environment, as shown in FIG. 7. As the thin film 820 may provide a hermetic seal, the need for a desiccant is therefore eliminated as the hermetic seal prevents moisture from entering the package structure 800 from the ambient environment. In another embodiment, the thin film 820 provides a semi-hermetic seal and a desiccant is included within the package structure 800 to absorb excess moisture.

A desiccant may be used to control moisture resident within the package structure 800. However, as the thin film 820 may provide a hermetic seal, depending on the material selected, a desiccant is not necessary to prevent moisture from traveling from the atmosphere into the interior of the package structure 800. In the case of a semi-hermetic thin film 820, the amount of desiccant required is reduced.

In an embodiment, the method of packaging an interferometric modulator according to this embodiment integrates the sealing of the package structure 800 into the front-end processing and eliminates the need for a separate backplane, desiccant, and seal, thereby lowering the cost of packaging. In another embodiment, the thin film 820 reduces the amount of desiccant required rather than eliminating the need for a desiccant. Packaging in accordance with these embodiments reduces the material constraints with respect to both the desiccant and seal, thereby allowing a greater choice or materials, geometries, and opportunities to reduce costs. The thin film 820 can reduce hermetic requirements to allow for not only elimination of a backplane but also allows any additional moisture barrier requirements to be incorporated into the module level packaging. It is generally desirable to keep the package structure as thin as possible and the package structure 800 shown in FIG. 7 provides for a thin structure.

The elimination of the need for a desiccant also allows the package structure 800 to be even thinner. Typically, in packages containing desiccants, the lifetime expectation of the device may depend on the lifetime of the desiccant. When the desiccant is fully consumed, the interferometric modulator display will fail as sufficient moisture enters the package structure to cause damage to the interferometric modulator. The theoretical maximum lifetime of the device is determined by the water vapor flux into the package as well as the amount and type of desiccant. In this package structure 800, the interferometric modulator 830 will not fail due to a consumed desiccant as the package structure 800 of this embodiment does not contain any desiccant.

In another embodiment, the thin film 820 is not hermetic and may be permeable to xenon diflouride ($XeF_2$) or another removal gas, which reacts with the sacrificial layer 850 to remove it, leaving a cavity 840 between the interferometric modulator 830 and the thin film 820. According to this embodiment, some suitable materials for the thin film 820 include, but are not limited to porous alumina and certain aerogels. In this embodiment, it is not necessary for the thin film 820 to be formed with any openings so long as it is permeable to xenon diflouride ($XeF_2$) or another removal gas. Preferably, after removal of the sacrificial layer 850, a hermetic overcoat layer 860 is deposited over the thin film 820 to hermetically seal the package structure 800. In these embodiments, the overcoat layer 860 is preferably formed of a metal.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A display device, comprising:
an electromechanical device disposed on a substrate and having a first opening, the electromechanical device including a first sacrificial layer and a movable layer disposed over at least a portion of the sacrificial layer;
a second sacrificial layer positioned over the electromechanical device and exposed to the first sacrificial layer through the first opening, wherein the first sacrificial layer and the second sacrificial layer are formed of different materials; and
a thin film backplane having a second opening, the thin film backplane positioned over the second sacrificial layer and sealing the electromechanical device within a package formed between the substrate and the thin film backplane.

2. The display device of claim 1, wherein at least one of the first sacrificial layer and the second sacrificial layer is configured to be removed with xenon diflouride.

3. The display device of claim 1, wherein the first sacrificial layer is formed of at least one of molybdenum, silicon, tungsten, and titanium.

4. The display device of claim 1, wherein the second sacrificial layer is formed of at least one of molybdenum, silicon, tungsten, and titanium.

5. The display device of claim 1, wherein the thin film backplane is formed of a hermetic material.

6. The display device of claim 1 further comprising a desiccant disposed in the package between the thin film backplane and the electromechanical device.

7. The display device of claim 1 further comprising an overcoat layer deposited over at least a portion of the thin film backplane.

8. The display device of claim 7, wherein the overcoat layer is deposited over the entirety of the thin film backplane.

9. The display device of claim 7, wherein the overcoat layer is formed of at least one of a hermetic material, a vapor barrier material, and a polymer.

10. The display device of claim 1, wherein the substrate includes a transparent substrate.

11. The display device of claim 1, wherein the thin film backplane is formed of at least one of a metal and a polymer.

12. A method of manufacturing a display device, comprising:
providing an electromechanical device on a substrate, the electromechanical device having a first opening and including a first sacrificial layer and a movable layer disposed over at least a portion of the sacrificial layer;
depositing a second sacrificial layer over the electromechanical device such that the second sacrificial layer is exposed to the first sacrificial layer through the first opening, the first sacrificial layer and the second sacrificial layer formed of different materials; and
depositing a thin film backplane over the second sacrificial layer to seal the electromechanical device within a package formed between the substrate and the thin film backplane, the thin film backplane having a second opening.

13. The method of claim 12 further comprising depositing an overcoat layer over at least a portion of the thin film backplane.

14. The method of claim 12 further comprising removing at least one of the first and the second sacrificial layers with xenon diflouride.

15. A display device, comprising:
  an electromechanical device disposed on a substrate, the electromechanical device having a first opening and including a movable layer disposed over at least a portion of a first sacrificial layer;
  a second sacrificial layer positioned over the electromechanical device, the second sacrificial layer exposed to a portion of the first sacrificial layer through the first opening;
  a thin film backplane disposed over the second sacrificial layer such that a package structure is formed between the thin film backplane and the substrate; and
  a desiccant disposed within the package structure.

16. The display device of claim 15, wherein the desiccant is disposed between the thin film backplane and the electromechanical device.

17. The display device of claim 15, wherein the thin film backplane is formed of a metal or a polymer.

18. The display device of claim 15 further comprising an overcoat layer deposited over at least a portion of the thin film backplane.

19. A method of manufacturing a display, the method comprising:
  providing an electromechanical device on a substrate, the electromechanical device having a first opening and including a movable layer disposed over a first sacrificial layer;
  depositing a second sacrificial layer over the electromechanical device and the desiccant, the second sacrificial layer exposed to a portion of the first sacrificial layer through the first opening;
  depositing a thin film backplane over the second sacrificial layer such that a package structure is formed between the thin film backplane and the substrate, wherein a desiccant is contained within the package structure; and
  removing the first and the second sacrificial layers, wherein removing the second sacrificial layer provides a gap above the electromechanical device and below the thin film backplane, and wherein at least part of the desiccant is not removed with the first sacrificial layer and the second sacrificial layer.

20. The method of claim 19, wherein at least a part of the first sacrificial layer is removed concurrently with at least a part of the second sacrificial layer.

21. The method of claim 19, wherein substantially all of the first and the second sacrificial layers are removed at the same time.

22. The method of claim 19, wherein at least one of the first sacrificial layer and the second sacrificial layer is removed with xenon difluoride.

23. The method of claim 19, wherein the first sacrificial layer and the second sacrificial layer are formed of different materials.

24. The method of claim 19, wherein the first sacrificial layer or the second sacrificial layer is formed of at least one of molybdenum, silicon, tungsten, or titanium.

25. The method of claim 19 further comprising depositing an overcoat layer over the thin film backplane, wherein the overcoat layer is formed of polymer.

26. The method of claim 19, wherein the thin film backplane is formed of a hermetic material.

27. The method of claim 19, wherein the thin film backplane is formed of a metal.

* * * * *